(12) United States Patent
Neurauter et al.

(10) Patent No.: US 8,674,754 B2
(45) Date of Patent: Mar. 18, 2014

(54) LOOP FILTER AND PHASE-LOCKED LOOP

(75) Inventors: Burkhard Neurauter, Linz (AT);
Harald Pretl, Schwertberg (AT);
Rastislav Vazny, Linz (AT); Thomas Greifeneder, Gallneukirchen (AT)

(73) Assignee: Intel Mobile Communications GmbH, Neubiberg (DE)

( * ) Notice: Subject to any disclaimer, the term of this patent is extended or adjusted under 35 U.S.C. 154(b) by 1063 days.

(21) Appl. No.: 11/704,544

(22) Filed: Feb. 9, 2007

(65) Prior Publication Data
US 2008/0191759 A1    Aug. 14, 2008

(51) Int. Cl.
*H03B 1/00*    (2006.01)
*H03K 5/00*    (2006.01)
*H04B 1/10*    (2006.01)

(52) U.S. Cl.
USPC ............................. 327/553; 327/558; 327/156

(58) Field of Classification Search
USPC .......................................... 327/553, 558, 156
See application file for complete search history.

(56) References Cited

U.S. PATENT DOCUMENTS

| | | | | |
|---|---|---|---|---|
| 4,940,952 | A * | 7/1990 | Kegasa | 331/11 |
| 5,675,292 | A * | 10/1997 | McCune, Jr. | 331/17 |
| 6,192,094 | B1 * | 2/2001 | Herrmann et al. | 375/375 |
| 6,784,728 | B2 * | 8/2004 | Fischer | 327/554 |
| 6,819,197 | B2 * | 11/2004 | Maldonado | 333/17.1 |
| 6,977,537 | B2 * | 12/2005 | Chaudhuri et al. | 327/156 |
| 7,106,140 | B2 * | 9/2006 | Mone | 331/16 |
| 7,199,668 | B2 * | 4/2007 | Kishida | 330/311 |
| 2001/0050579 | A1 * | 12/2001 | Han | 327/156 |
| 2003/0212971 | A1 * | 11/2003 | Rodgers et al. | 716/6 |
| 2004/0008095 | A1 * | 1/2004 | Siavash | 333/168 |
| 2005/0062544 | A1 * | 3/2005 | Kishida | 330/308 |
| 2008/0211685 | A1 * | 9/2008 | Grady et al. | 340/689 |

FOREIGN PATENT DOCUMENTS

| | | |
|---|---|---|
| DE | 19954255 A1 | 6/2000 |
| DE | 60203254 A1 | 2/2006 |
| JP | 2004140688 A * | 5/2004 |

OTHER PUBLICATIONS

English translation of the specification of JP 2004-140688A.*
English translation of the claims of JP 2004-140688A.*
"A Robust GSM/EDGE Transmitter Using Polar Modulation Techniques", Christian Mayer, Burkhard Neurauter, Günter Märzinger, Christian Münker and Richard Hagelauer, Proceedings of the European Conference on Wireless Technology, 2005, pp. 93-96.
"Theory and Application of Phase-Locked Loops", Roland Best, Edition AT Verlag, 1993, pp. 94-125.

* cited by examiner

*Primary Examiner* — Quan Tra
(74) *Attorney, Agent, or Firm* — Eschweiler & Associates, LLC (57) ABSTRACT

A loop filter includes an input terminal, an output terminal, and a control terminal for a selection signal. At least one low pass filter is disposed between that input terminal and that output terminal. The loop filter is adapted to select a configuration out of a first configuration and at least one second configuration in response to the selection signal. In the first configuration, the loop filter comprises a non-integrating transfer characteristic in operation. In the second configuration, the loop filter comprises an integrating signal transfer characteristic in operation.

20 Claims, 6 Drawing Sheets

LOOP FILTER AND PHASE-LOCKED LOOP

FIELD OF THE INVENTION

The invention relates to a loop filter having different adjustable configurations. The present invention also relates to a phase-locked loop with the loop filter.

BACKGROUND OF THE INVENTION

The ongoing development of high-frequency signal processing, particularly in the telecommunication area, strives for a higher level of integration. These integrated circuits may comprise a complete high-frequency transmitter or receiver, respectively, including an HF-section to convert a base band signal onto an RF carrier. Such transceivers may support a multi-mode ability which allows using different kinds of mobile communication standards. Flexibility of such a solution is improved and the required chip space can be reduced. Such communication standards, for example, may include the 2.5th generation standards like GSM (General Systems for Mobile), GPRS, or EDGE. More recent developed communication standards, the 3rd Generation (3G), includes the standard WCDMA (Wideband Code Division Multiple Access) also called UMTS (Universal Mobile Telecommunication System). For transmitting and receiving higher data rates, Fourth Generation (4G) communication standards may be used, including WLAN (Wireless LAN) or WIFI. The different standards use different modulation techniques and center frequencies for transmitting and receiving signals. The different and sometimes opposing requirements with respect to the different mobile communication standards result in higher chip size and power consumption of a multi-mode transceiver integrated circuit.

Consequently, there is a need to reduce the required chip size for integrated circuits capable of transmitting or receiving high-frequency signals.

BRIEF DESCRIPTION OF THE DRAWINGS

The invention is explained in detail below using exemplary embodiments with reference to the drawings in which.

DETAILED DESCRIPTION OF THE INVENTION

In the following description, further aspects and embodiments of the present invention are disclosed. In addition, reference is made to the accompanying drawings which form a part hereof, and in which is shown by way of illustration in which the invention may be practiced. The embodiments of the drawings present a discussion in order to provide a better understanding of one or more aspects of the present invention. The disclosure is not intended to limit the feature or key elements of the invention to a specific embodiment. Rather, the different elements, aspects, and features disclosed in the embodiments can be combined in different ways by a person normally skilled in the art to achieve one or more advantages. It is to be understood that other embodiments may be utilized and structural or logical changes may be made without departing from the scope of the invention. The elements of the drawings are not necessarily to scale relative to each other. For illustration purposes, some frequency ranges and communication standards are specified. The named communication standards are not restricted to the embodiments disclosed herein. Like reference numerals designate corresponding similar parts.

When designing a transmitter or receiver usable for a plurality of different mobile communication standards, the requirements regarding the mandatory modulation type and scheme might be different. For example, when transmitting or receiving a continuous signal, good phase rigidity is important, while for pulsed signals in communication standards using time division multiple access, fast loop dynamics are required.

Consequently, one embodiment of the invention refers to a loop filter capable of different modes of operation. A further aspect relates to a phase-locked loop comprising an adjustable lock type.

Depending on the required application and the communication standard for the signal to be transmitted or received, different types of phase-locked loops might be useful. The loop filter of such phase-locked loops can be switched between a first mode of operation and a second mode of operation. In the first mode of operation called type I mode, the loop filter comprises a non-integrating transfer characteristic. In such mode, a signal at an input terminal of the loop filter is filtered by a low pass filter without any additional integrating measures. The filtered signal is then provided at an output terminal.

Such loop filter can be arranged in a phase-locked loop for which a fast loop dynamic, a high role-off factor, and a good suppression of phase noise which are generated in the feedback loop of the phase-locked loop is required.

In a second mode of operation, called type II mode, the loop filter may comprise an integrating signal transfer characteristic. In an embodiment, in which the loop filter is capable of both modes of operation, the loop filter may comprise an adjustable element, that element having an integrating signal transfer characteristic. Depending on the required mode of operation, the adjustable element can be selected in response to a selection signal. The loop filter may therefore comprise a low pass filter and an adjustable element having an integrating signal transfer characteristic. The element can be switched to be in operative electrical connection to the low pass filter in response to the desired operation mode of the loop filter.

In one embodiment, that element may comprise a series circuit of a switch adjustable by a selection signal and a resistor coupled thereto. A further capacitor may be connected in parallel to the series circuit. The capacitive element is in operative electrical connection with the resistor of the loop filter, resulting in an integrating signal transfer characteristic when the switch is open in the second mode of operation of the loop filter.

The loop filter may comprise passive elements like capacitors having an integrating signal transfer characteristic. As an alternative, the loop filter may comprise active elements with, for example, operational amplifiers. In one embodiment of the invention, active elements are circuits, which provide gain in operation. That active element may have an integrated signal transfer characteristic.

In a further embodiment, the loop filter may comprise further elements to improve phase stability of the loop filter. For example, the loop filter may comprise a series circuit comprising a switch adjustable by the selection signal, a resistor, and at least one capacitor connected thereto. In the second mode of operation, the at least one capacitor is coupled to that input terminal via the resistor. In the first mode of operation, the capacitor is coupled to the input terminal of the loop filter bypassing the resistor.

The loop filter can be integrated into a phase locked loop. Such loop can be used for different modes of operation. Depending on the overall transfer characteristic, the loops are called type I or type II phase locked loops. In a further embodiment, the phase-locked loop may comprise a feedback path, a phase detector device with a reference signal input for a reference signal, and a feedback signal input coupled to that feedback path. A charge pump is coupled to an output of the phase detector arrangement. The loop filter, adapted to select an operating mode out of a first and a second operating mode in response to a selection signal, is coupled to an output of the charge pump. Finally, an oscillator device comprising a tuning input terminal and an output is coupled with its tuning input terminal to an output of the loop filter. The output of the oscillator device is connected to the feedback path.

The phase-locked loop according to one embodiment comprises a selectable first type and second type of operation. In the first type, the phase-locked loop comprises an integrating signal transfer characteristic generated by the oscillator device alone. A phase locked loop in such configuration is called Type I PLL. In the second mode phase-locked loop, the oscillator device as well as the loop filter comprises an integrating signal transfer characteristics, representing a Type II PLL.

In another embodiment, the phase detector arrangement comprises a first phase detector and a second phase detector. The first phase detector is activated in the first mode of operation, in which no additional integrating signal transfer characteristic is required. In the second mode of operation when operating as a Type II PLL, only the second phase detector is activated. For activating and deactivating the respective phase detectors, the input terminals of the phase detectors may be coupled to output terminals of logic gates. The logic gates can be controlled by the selection signal.

Depending on the required operation mode, different kinds of charge pumps may be useful. In one embodiment, the phase-locked loop may comprise a charge pump device having a source charge pump and a sink charge pump. The source charge pump is activated in the first and second mode of operation. The sink charge pump is activated only in the second mode of operation, for which the loop comprises an additional integrating signal transfer characteristic in the loop filter. For the first mode of operation, the sink charge pump may be switched to an off state comprising a high-ohmic or high impedance condition.

Figure 1:
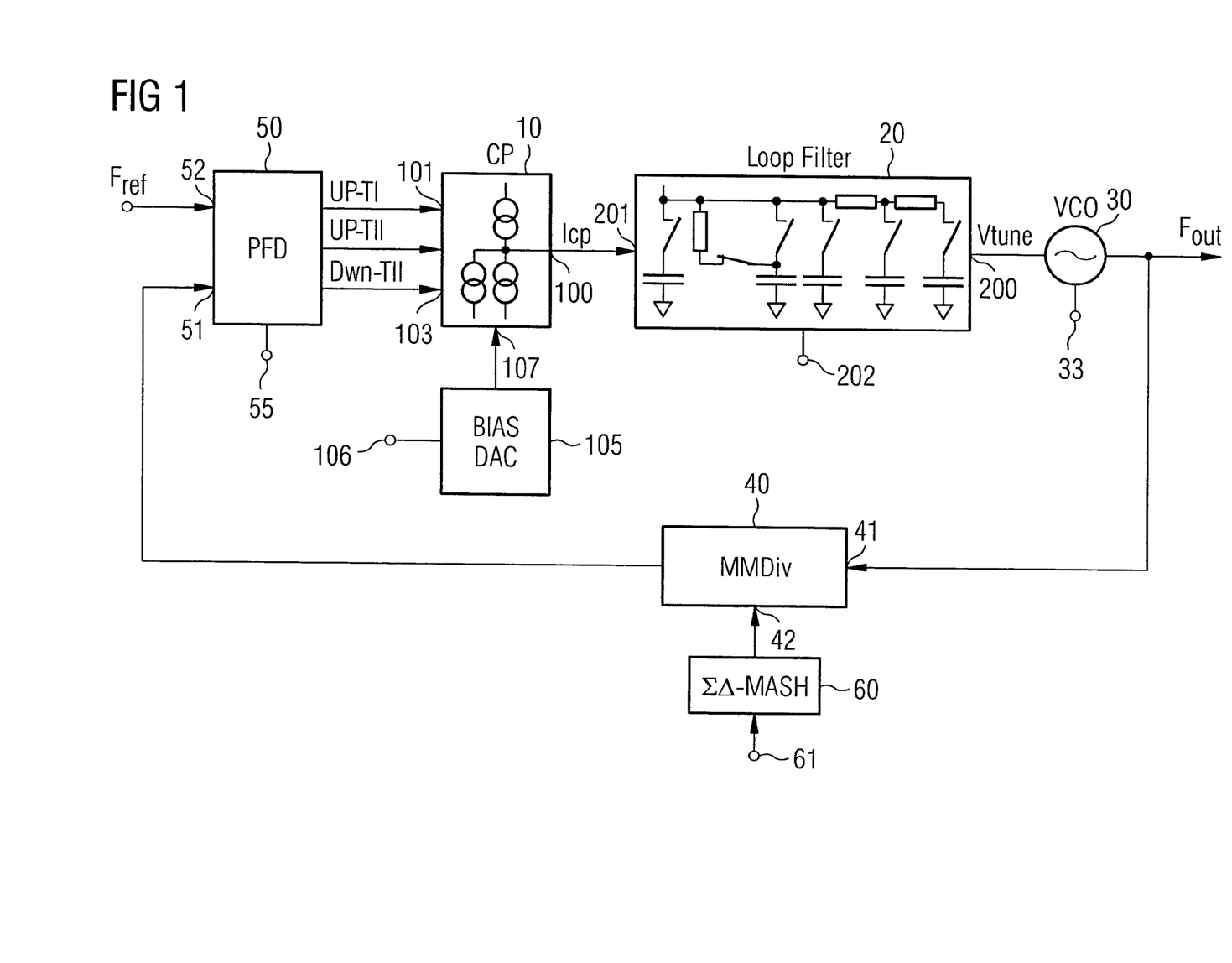
FIG. 1 shows an exemplary embodiment of a phase-locked loop in a first embodiment.

FIG. 1 shows a phase-locked loop with an adjustable loop type. Phase-locked loops are used in integrated circuits to provide a frequency stable signal having the frequency Fout. Depending on the application, namely the data content and the communication standard to be transmitted or received, the signals of a phase-locked loop require different parameters. For example, the 2.5th generation mobile communication standards GSM or EDGE require a low group delay, fast loop dynamics as well as a high roll-off factor. Those parameters can be achieved with phase-locked loops of type I. On the other hand, third generation mobile communication standards like, for example, WCDMA/UMTS are transmitting and receiving continuous signals. A continued signal generation may change the temperature of a phase-locked loop. Consequently, a phase-locked loop used for third generation communication standards depend on high phase rigidity over a high temperature range. For this purpose, type II PLLs are used.

The phase-locked loops of type I and type II differ in the additional integrating behavior and signal transfer characteristics of the used loop filter within the forward path of the locked loop. Normally, a phase-locked loop comprises a signal oscillator which can be voltage or current controlled. The oscillator itself comprises already an integrating signal transfer characteristic. A type II phase-locked loop comprises an element in the forward path with an additional integrating signal transfer characteristic next to the characteristic of the oscillator.

The phase-locked loop according to FIG. 1 comprises a voltage controlled oscillator device 30 having an integrating signal transfer characteristic in the forward path. The oscillator device 30 comprises a tuning input for a tuning signal Vtune. The tuning input is connected to an output of an adjustable loop filter 20. The loop filter comprises an input terminal 202 for a selection signal. In response to the selection signal, the loop filter can change its signal transfer characteristic between a non-integrating and an integrating characteristics. With a non-integrating signal transfer characteristic, the phase-locked loop according to FIG. 1 becomes a type I PLL. If, consequently, the loop filter 20 also comprises an integrating signal transfer characteristic, the phase-locked loop is configured as a type II PLL.

The input terminal 201 of the loop filter 20 is connected to an output terminal 100 of a charge pump device 10. The charge pump device 10 is supplied and controlled by a bias unit 105 also comprising a digital-to-analog converter. The bias unit 105 adjusts the reference current and switches the charge pump device 10 in response to the desired signal transfer characteristics of the loop filter 20.

Further, a phase detector arrangement 50 is disposed in the forward path. The phase detector arrangement 50 comprises phase detectors usable for type I and type II phase-locked loops. The phase detector arrangement 50 comprises three output terminals for type I and type II signals, respectively. As one can see, for phase-locked loops in type II configuration, the phase detector arrangement 50 comprises an output terminal UP-TII and an output terminal DWN-TII. These output terminals are used for the up and down signal for type II PLL. For type I PLLs, for which the loop filter does not comprise an additional integrating behavior, a signal output terminal for an UP-T1 signal is sufficient. The output terminals of the phase detector arrangement 50 are connected to input terminals 101 and 103 of the charge pump device 10. Upon response of a mode selection signal at the control input 55, one of the phase detectors within the phase detector arrangement 50 is activated, preparing the loop for type I or type II PLL operation.

The phase detector arrangement 50 further comprises a feedback input terminal 51 and a reference input terminal 52. A reference signal $F_{ref}$ having a reference frequency is applied at terminal 52. The second terminal 51 is connected to the feedback path of the phase-locked loop. The feedback path comprises a multi-mode divider 40, whose division ratio is adjustable by a control word at input terminal 42. The input 41 of divider 40 is connected to the output terminal of the voltage-controlled oscillator 30. The feedback path and more particularly the divider 40 divides a signal at the input terminal 41 in its frequency and provides a frequency divided signal at the feedback input terminal 51 of the detector arrangement 50. The terminal 42 of the multi-mode divider 40 is connected to an Σ-Δ-modulator 60. The MASH-modulator 60 controls the division ratio of the multi-mode divider 40 in response to a frequency control word at control terminal 61.

In response to the desired loop type of the phase-locked loop, a selection signal is applied at the terminals 202 of the loop filter 20, terminal 55 of the phase detector arrangement 50, and at terminal 106 of the bias circuit 105. The selection signal configures the phase-locked loop for the desired operation mode.

Figure 2A:
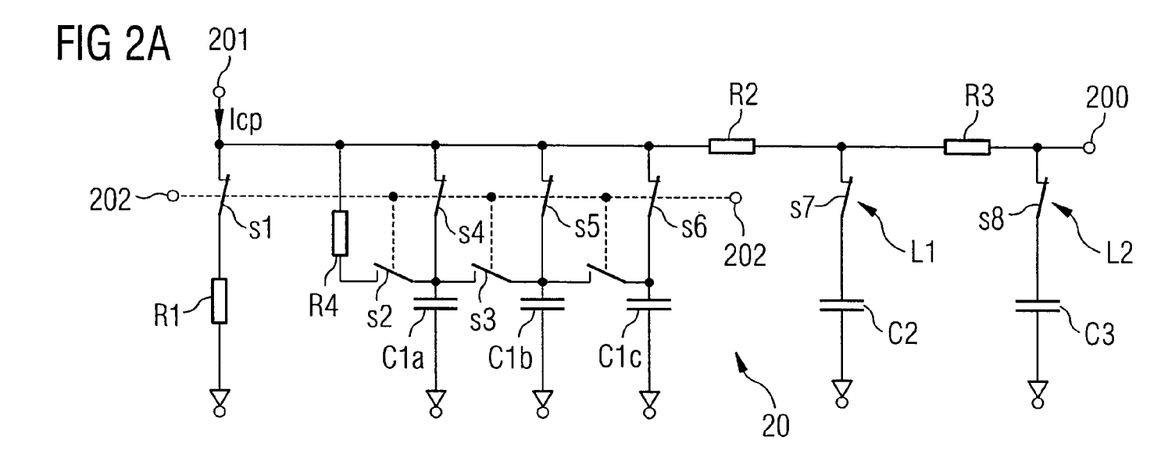
FIG. 2A shows an exemplary embodiment of a passive loop filter in a first mode of operation for a type I phase-locked loop according to the invention.

FIG. 2A shows an adjustable passive loop filter configured for type I phase-locked loops. In this configuration, the passive loop filter comprises a non-integrating signal transfer characteristic. Any signal Icp applied to input terminal 201 is filtered by a low pass filters L1, L2 and provided at output terminal 200. For this purpose, the loop filter comprises a first low pass L1 having a resistor R2 and a capacitor C2 connected in series to a second low pass filter L2 comprising resistor R3 and a capacitor C3. Between the resistors R2, R3 and the respective capacitors C2, C3 of the filters, a first switch S7 and a second switch S8 are arranged. The switches are realized as transmission gates and are used for calibration purposes of the loop filter. The RC low pass filters generate two poles in the signal transfer characteristics of the loop filter.

In addition, the loop filter comprises a series circuit of a first switch S1 and a resistor R1 coupled to the input terminal 201 and to resistor R2 of the first low pass filter. A second switch S6 is coupled to a capacitor C1c and connected in parallel to the series circuit. The switches S1 and S6 are controlled or adjusted by the selection signal at control terminal 202. In addition to the capacitor C1c, a second and third capacitor C1a and C1b are disposed in parallel to the first capacitor C1c. Between the second and third capacitor C1a, C1b, a third and fourth switch S4 and S5 are arranged. The switches are coupling the capacitors C1a, C1b to terminal 201 in type I operation. In one embodiment of the invention, the selection signal at the control terminal 202 is a multi-bit control word, wherein an individual, independent signal is applied to each of the switches in the circuit. Alternatively, some of the switches that operate in conjunction with each other for both modes of operation may receive the same signal, as may be appreciated by one of ordinary skill in the art.

The type I loop configuration shown herein is realized by the series circuit including resistor R1 and the capacitors C1a to C1c connected in parallel. The further switches S2 and S3 connecting the second and third capacitors C1a, C1b to a resistor R4 are deactivated. In this configuration, any current Icp at the input terminal 201 is divided and applied to the low pass filters L1 and L2 and the series circuit of resistor R1 and switch S1. Any potential at the input terminal 201 generated by the charge pump 10 is decreased by the resistor R1. Consequently, in operation of a type I phase-locked loop, the charge pump is only required to increase the charge end potential at input terminal 201. The capacitors C1a to C1c do not comprise an integrating behavior in the configuration but stabilize and filter the loop signal.

Figure 2B:
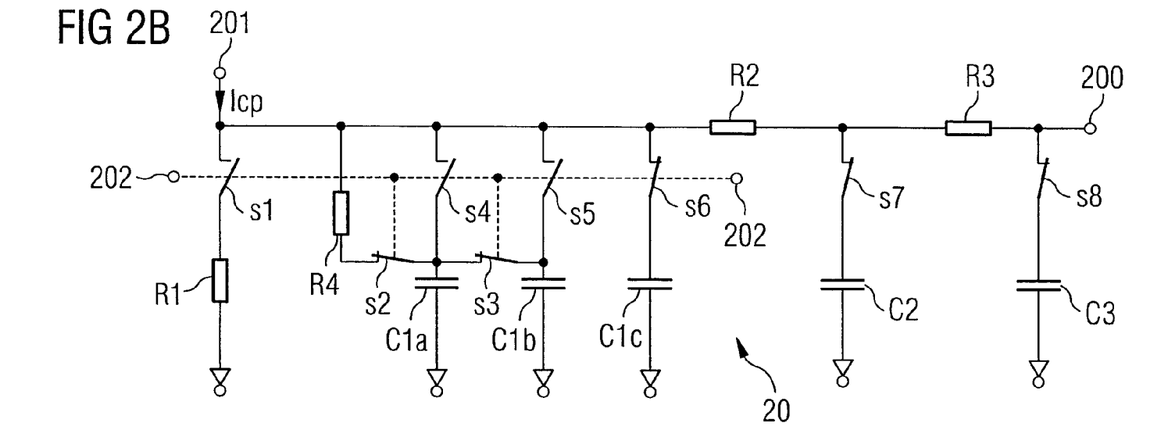
FIG. 2B shows an exemplary embodiment of a passive loop filter in a second mode of operation for a type II phase-locked loop according to the invention.

FIG. 2B shows the loop filter in a type II configuration. In this configuration, the switches S1 as well as S4 and S5 are opened. As a result, the resistor R1 is deactivated while the capacitors C1a and C1b are coupled to the input terminal 201 via the second resistor R4. In this configuration, the capacitor C1c creates an additional pole in the signal transfer characteristic of the loop filter, thereby resulting in an integrating signal transfer characteristic. At the same time, the stability of the loop filter is ensured by the series connection of the second resistor R4 and the two capacitors C1a, C1b. The transfer characteristic as well as the stability of the loop filter is depending on the values of the capacitors C1a to C1c and the resistors.

To increase stability and improve the cut-off frequency range, the loop filters according to FIGS. 2A and 2B can be modified in various ways.

Figure 3:
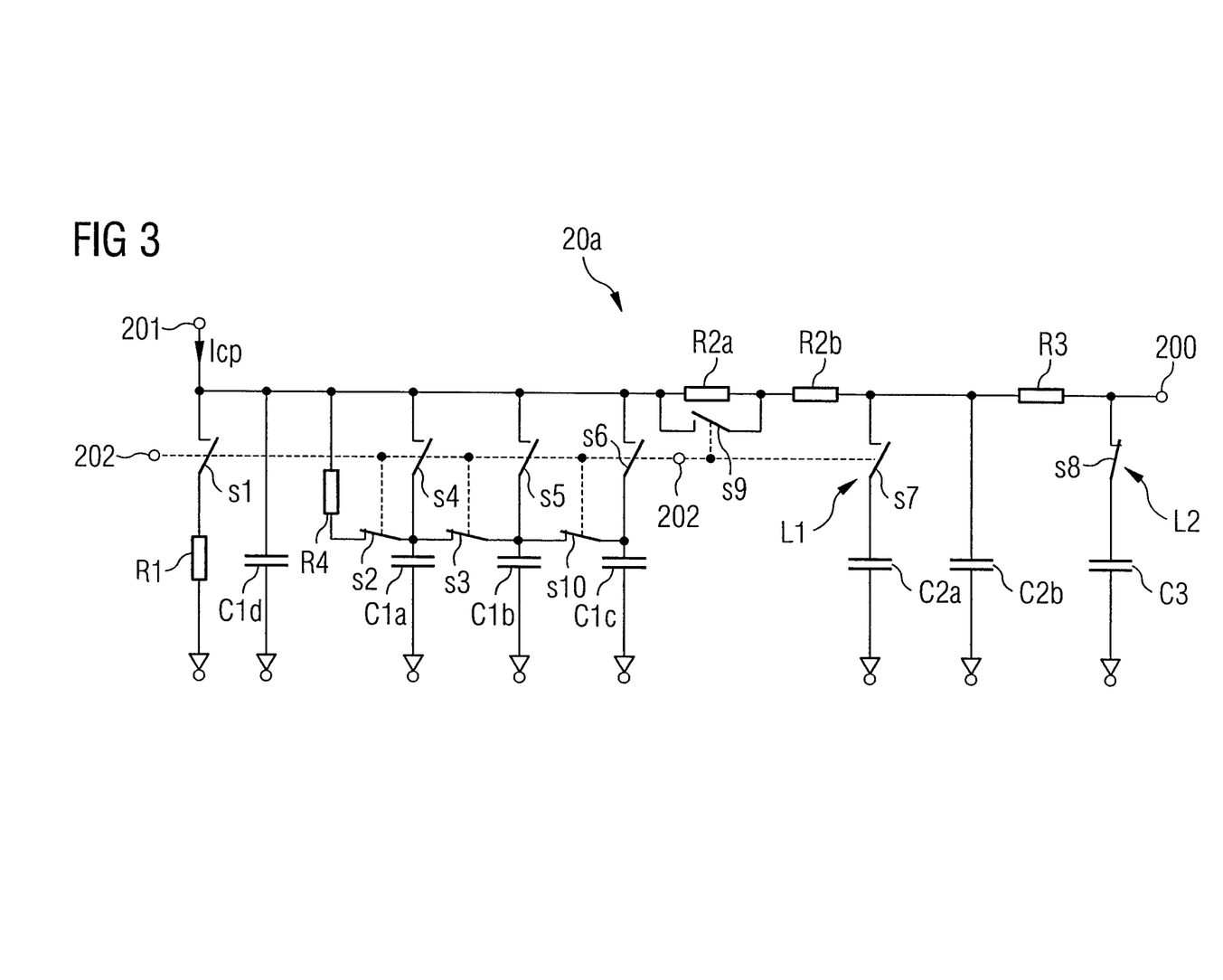
FIG. 3 shows a different exemplary embodiment of a passive loop filter according to the invention.

FIG. 3 shows such modification with improved performance in a configuration of a type II operation mode. In this configuration, the loop filter 20A comprises an element having an integrating signal transfer characteristic. The element comprises a series circuit of a resistor R1 and a switch S1 connected in parallel to a capacitor C1d. The switches S2, S3, and S10 are closed, thereby realizing a series circuit of the resistor R4 and an element with a capacitance equal to the sum of the capacitors C1a to C1c. While the capacitor C1d creates the additional pole for the type II operation mode, the capacitor C1a to C1c connected in series are stabilizing the transfer behavior of the loop filter. Normally, the capacitance values of capacitors C1a to C1c are in the range of some hundred pF while the capacitor C1d is much smaller in the range of some pF. The smaller capacitance of capacitor C1d is sufficient to achieve the desired integrating signal transfer characteristic of the loop filter in type II operation when the switch S1 is opened.

In addition, the switch S9 as well as the switch S7 is opened. Consequently, the first low pass filter comprises in a type II operation, a higher ohmic or impedance value with respect to type I operation when switch S9 is closed. Still, the first low pass filter L1 comprises a lower total impedance. The values of the resistor R2a and the capacitors C2A are chosen in such a way that the cut-off frequency of the first low pass filter remains similar. However, the higher ohmic resistance or impedance of the first low pass filter reduces the total load to the loop filter.

An adjustable loop filter can also be realized using active elements. The term active elements according to one embodiment represent components that can be used to provide gain in an electronic circuit. Accordingly, active components require a source of energy to perform its intended function.

Figure 4A:
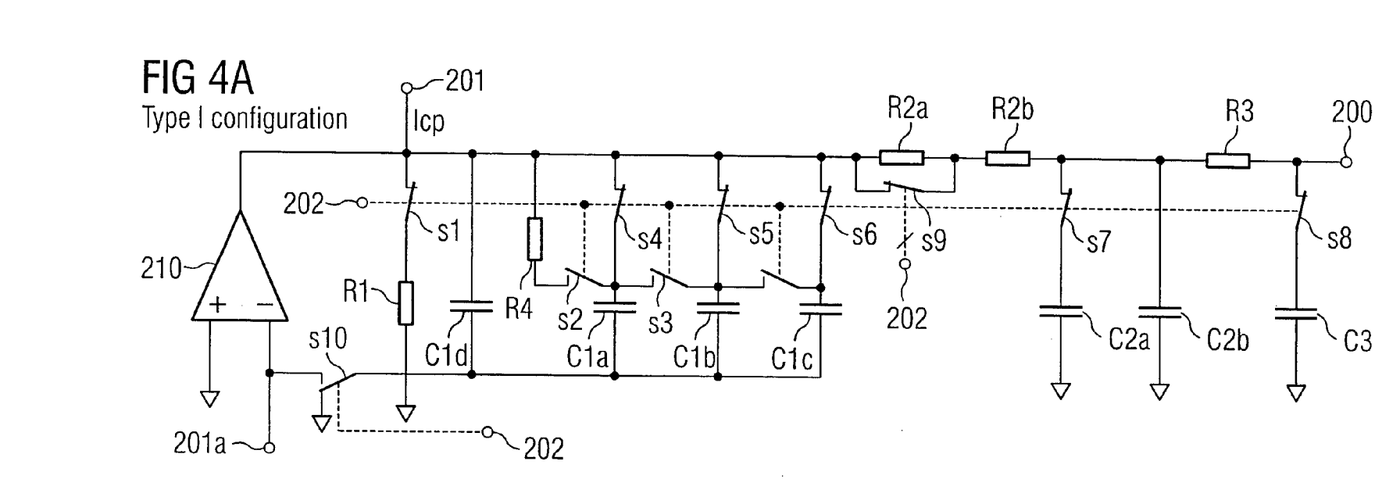
FIG. 4A shows an exemplary embodiment of an active loop filter in the first mode of operation.

FIG. 4A shows an exemplary embodiment of a loop filter having an operational amplifier as an active element. The loop filter comprises two low pass filters connected in series similar to the embodiment according to FIG. 3. Again the switches S1 to S9 are coupled to the control terminal 202 for selection of the operation mode. The second terminals of the capacitors C1a to C1d are connected to a further switch S10, which can be adjusted by a control signal at terminal 202.

The loop filter in this embodiment further comprises an operational amplifier 210 arranged in parallel to the capacitors and the resistor R1. The operational amplifier comprises a first input terminal for a reference potential and a second terminal which is connected to terminal 201a. The output of the operational amplifier 210 is connected to the input of the low pass filters and the first terminals of the capacitors C1a to C1d and the switch S1. In the configuration for type I operation, the switch S10 couples the second terminals of the capacitors to a terminal providing the ground potential. Since the operational amplifier is not required for type I operation, it is switched off.

Figure 4B:
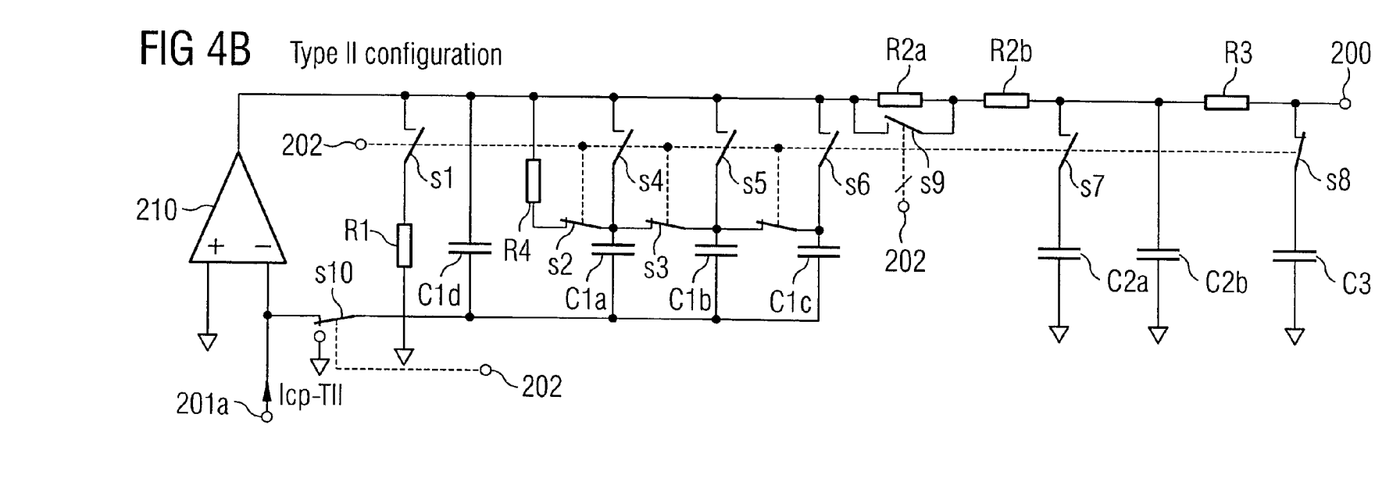
FIG. 4B shows an exemplary embodiment of an active loop filter in the second mode of operation.

FIG. 4B shows the loop filter with the operational amplifier in the configuration for a type II mode of operation. As one can see the switch S10 is closed connecting the terminal 200 to the second terminals of the capacitors C1a to C1d. Switches S1, S4 to S7 and S9 are opened, while the operational amplifier 210 is activated. In type II operation the charge pump current Icp is provided at terminal 201a, while the terminal 201 is switched off. The operational amplifier amplifies the differences between the potential at its input terminals and forwards the result to the low pass filters of the resistors R2, R3 and the capacitors C2, C3 respectively.

Figure 7:
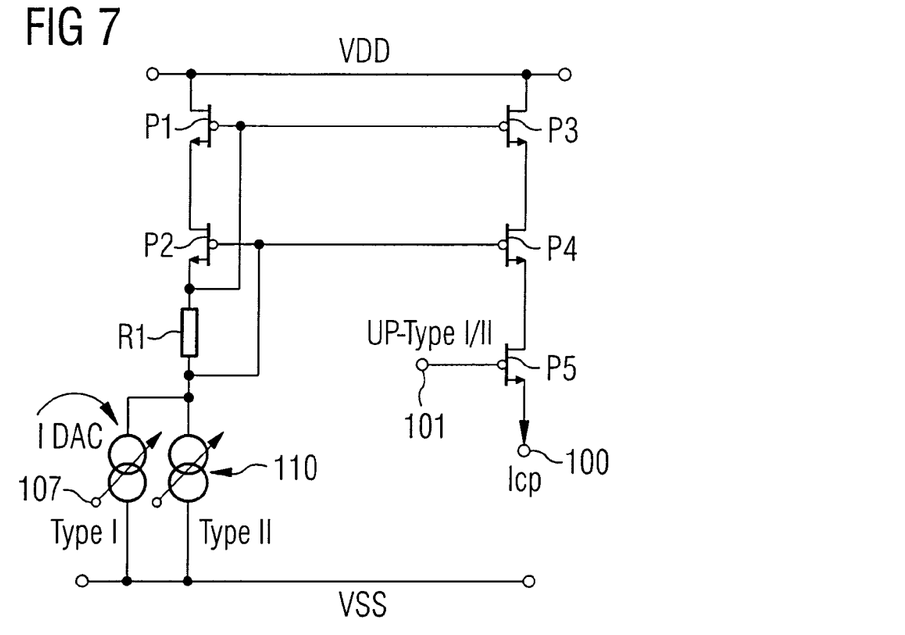
FIG. 7 shows an exemplary embodiment of a charge pump of type I and II phase-locked loops.

While in type I mode of operation, the loop filter discharges automatically through the resistor R1, in type II mode of operation, an active charging and discharging of the loop filter is required. For this purpose, the charge pump device 10 comprises different charge pumps to provide charging signal and discharging signal, respectively. FIG. 7 shows a charge pump for a charging signal, usable in type I and type II operations. The charge pump according to FIG. 7 comprises two different adjustable current sources 110. A control input 107 is coupled to the bias control circuit 105 as shown in FIG. 1. The two different current sources 110 are required due to the different operation modes. The first current source is selected by a respective control signal at terminal 107 for a type I operation. A second current source can be selectively added in a configuration for type II operation.

The current sources are coupled to a first current mirror and a second current mirror connected in series. More particularly, the current sources 110 are connected to a resistor R1 which is coupled in series to a first PMOS transistor P2 and a second PMOS transistor P1. The first PMOS transistor P2 and the second PMOS transistor P1 are the current mirror transistors of the first and second current mirror. The output terminal 100 is connected to a control transistor P5 whose gate is coupled to the input terminal 101 for the UP control signal for type I and type II operations. The transistor P5 is also connected to the second current mirror transistors P4 and P3, respectively. Depending on the selected operation mode, the current of one of the current sources is mirrored as a charge signal ECP at the output terminal 100 in response to the UP signal in type I or type II configuration at terminal 101.

Figure 8:
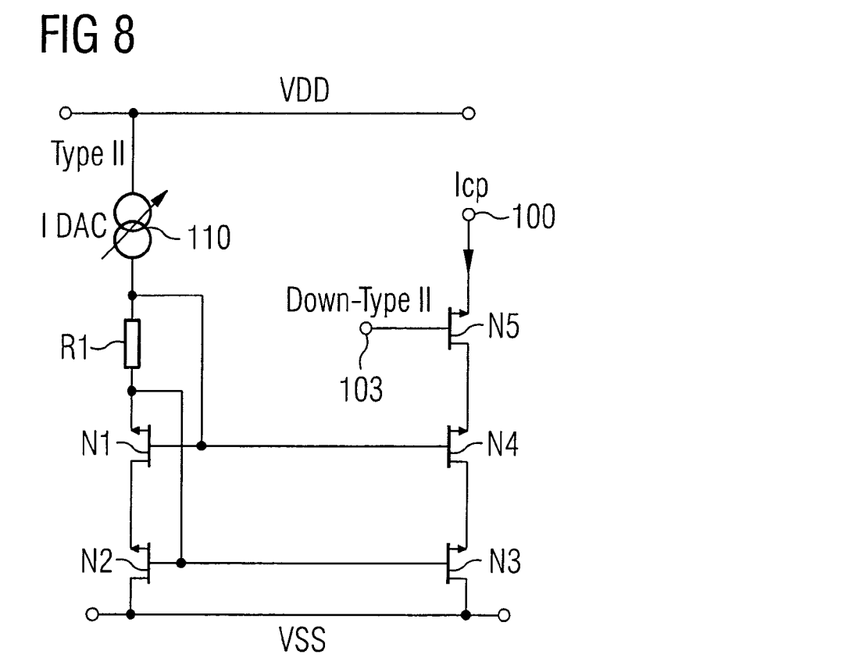
FIG. 8 shows an exemplary embodiment of the charge pump for a type II phase-locked loop.

The second charge pump of charge pump device 10 to generate the discharge signal at output terminal 100 can be shown in FIG. 8. The charge pump shown herein is similar to the charge pump according to FIG. 7. However, due to the fact that the down signal of the phase detector is applied only in type II operations, only one current source 110 for type II operations is required. The current source 110 is disposed between the drain potential VDD and the source potential VSS. Two current mirrors comprising the transistors N1, N4, and N2, N3, respectively, are disposed. The down signal of the phase detector arrangement is applied at the control terminal 103 connected to the gate of transistor N5. The output terminal of transistor N5 provides the discharging signal Icp at terminal 100.

Figure 5:
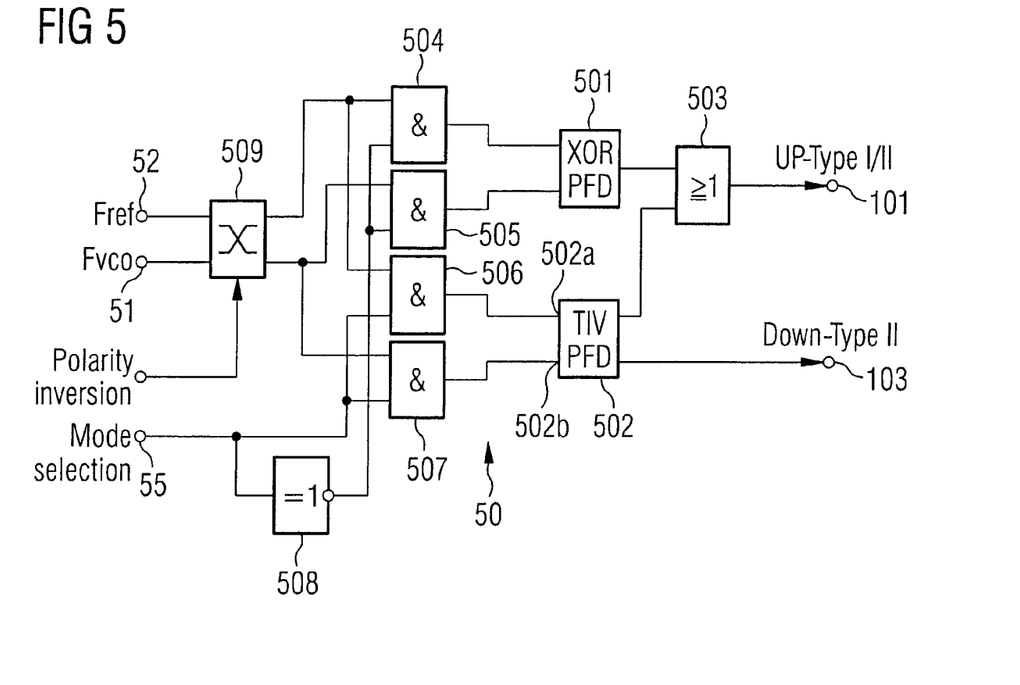
FIG. 5 shows a phase detection arrangement of an adjustable phase-locked loop.

To further improve the signal characteristic of an adjustable phase-locked loop, the phase detector arrangement 500 may comprise two different phase detectors used in the different configurations. Each of those phase detectors can be optimized for the respective operation mode.

FIG. 5 shows an example of a phase detector arrangement 50 with two phase detectors 501 and 502. A first phase detector 501 is used in a configuration for a type I mode of the loop filter. Phase detector 502 is activated when the loop is switched to type II mode of operation. For activation and deactivation purposes, four logic gates 504 to 507 are provided. The logic gates realized as logical AND gates are coupled with their output terminals to the respective input terminals of the two phase detectors. Each of the logic gates 504 to 507 comprises an activation input terminal coupled to the mode selection terminal 55 of the phase detector arrangement. In particular, the terminal 55 is connected directly to the respective activation terminals of logic gates 506 and 507 coupled to the second phase detector 502. The logic gates 504 and 505 are connected to an output terminal of an inverter 508, which in turn is coupled to terminal 55. The second terminals of the logic gates 504 to 507 are coupled to the reference signal input terminal 52 or the feedback input terminal 51, respectively. Logic gates 504 and 506 are connected to terminal 52 while the logic gates 505 and 507 are coupled to the feedback terminal 51.

The first phase detector 501 comprises an output terminal connected to a logic gate 503. The second input terminal of logic gate 503 is connected to an output of the second phase detector 502. The second phase detector 502 further comprises a second output connected to terminal 103 for the down signal DN in the type II configuration. Further, a polarity inversion device 509 is arranged between the terminals 52 and 51 and the respective input terminals of logic gates 504 to 507. Depending on the sign of the VCO gain $K_{VCO}$ in the arrangement 30, the phase of the feedback signal Fvco may be shifted by 180°. The polarity inversion device 509 switches the signal paths of terminals 52 and 51 in response to a polarity inversion signal to correct for such phase shifts.

In operation, one pair of the logic gates 504 to 507 is deactivated in response to the mode selection signal. The other now activated pair forwards the reference and the feedback signal at terminals 52 and 51 to the respective input of the phase detector. For example, if the phase-locked loop according to FIG. 1 is switched into configuration for a type I operation, the mode selection signal applied to terminal 55 comprises a low level, representing a logical "0". Consequently, the logic gates 506 and 507 and the second phase detector 502 are deactivated. The reference signal Fref and the feedback signal Fvco is put through the logic gates 504 and 505 and applied to the first phase detector 501.

In the configuration for type II operation, where an additional integrating signal transfer characteristic is required, the logic gates 504 and 505 are deactivated. The second phase detector 502 is switched on and reference as well as feedback signals are applied to its input terminals. The phase detector 502 determines a phase difference between the two applied signals and provides a corresponding up or down signal at its output terminals. The up or down signals are controlling the charge pump of charge pump device 10 and generating a corresponding charging or discharging signal.

Figure 6:
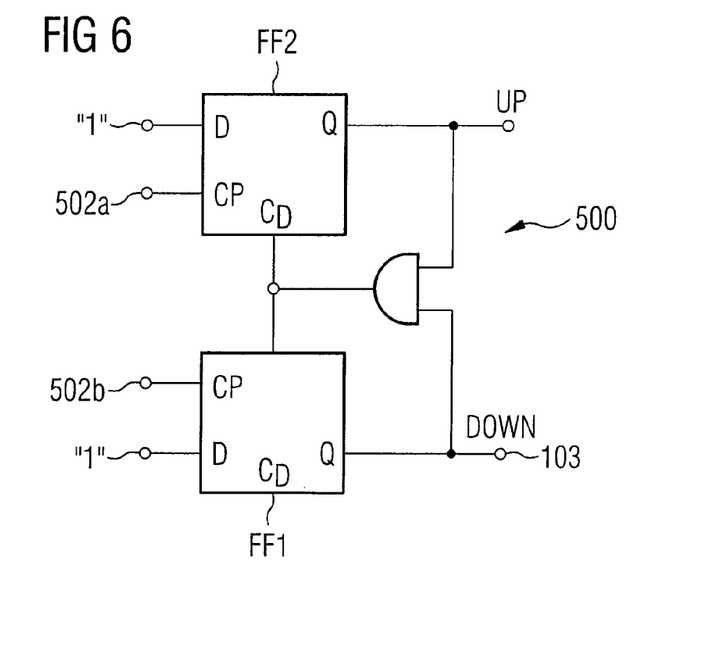
FIG. 6 shows an embodiment of a TIV phase detector as used in the phase detection arrangement of FIG. 5.

FIG. 6 shows a phase frequency detector 502 to use in the phase detector arrangement according to FIG. 5 according to one embodiment.

The phase frequency detector 502 comprises a first D-flip-flop FF1 and a second D-flip-flop FF2, each of them having a data input terminal D and a clock input terminal CP. At the data input terminals D a high level signal, representing a logical "1" is applied in operation. At the clock terminals 502b and 502a, respectively the signals from the logic gates 507 and 506 according to FIG. 5 are applied. The output terminal Q of the first D-flip-flop FF1 is connected to terminal 103. Correspondingly, the data output Q of the second flip-flop FF2 providing the upper signal UP is coupled to the logic gate 503 as seen in FIG. 5.

The phase frequency detector may comprise four different conditions independence to the input signals. One of those conditions, in which both flip-flops provide a high level at their output terminals Q is locked by a logical AND gate. For this purpose, the input terminals of the logical AND gate are connected to the output terminals of the respective flip-flops FF1, FF2. The output of the logic gate is coupled to the clear direct input terminals CD of both flip-flops. If a high level is applied at the CD input terminals the flip-flops are switching to low level at output Q, representing a logical "0". As a result, the phase frequency detector shown herein represents a tri-flip-flop, comprising three different possible states.

In operation according to one embodiment, the phase frequency detector determines positive clock edges of the signals applied to the clock inputs CP. A positive clock edge at one of the inputs CP of the respective flip-flops causes the phase frequency detector to switch in the next higher or lower state. For example, if the signal provided at both output terminals are at a low level, a logical "0" and a clock edge is applied to terminal 502a, the phase frequency detector switches to a higher state. The output Q of the second flip-flop FF2 provides a logical "1". Consequently, if a clock edge is applied at terminal 502b of the first flip-flop FF1 the phase frequency detector switches to the next lower state.

The second phase detector 500 of the phase detection arrangement according to FIG. 5 is used only for type I operation. This phase detector can be implemented more easily by, for example, the use of a simply XOR gate in one embodiment.

The proposed solution of an adjustable loop filter allows the realization of applications for phase-locked loops configurable for type I and type II operations. However, the total size of such solution is similar to a phase-locked loop in the configuration for type II operation only. In addition, the adjustable loop filter as well as the adjustable phase-locked loop can be used in transceivers for 2.5th and 3rd generation mobile communication standards. For example, a phase-locked loop according to the above disclosed embodiments could be used as a phase modulator as well as a frequency synthesizer. In the phase modulation mode, the loop is adjusted as a type I phase-locked loop. When signals according to the third generation mobile communication standard are employed, the phase-locked loop is switched to the type II operation mode using an additional integrating signal transfer characteristic in the loop filter.

The different features of the embodiments disclosed herein can be combined by one skilled in the art to achieve one or more advantages of the present invention. Although specific embodiments have been illustrated and described, it will be appreciated by one of ordinary skill in the art that any arrangement which is calculated to achieve the same purpose may be substituted for the specific embodiments shown. It is to be understood that the above description is intended to be illustrative and not restrictive. The application is intended to cover any variations of the invention. The scope of the invention includes any other embodiments and applications in which the above structures and methods may be used. The scope of the invention should therefore be determined with reference to the appended claims along with the scope of equivalents to which such claims are entitled.

It is emphasized that the abstract is provided to comply with 37cfr. Section 172(b) requiring an abstract that will allow the reader to quickly ascertain the nature and gist of the technical disclosure. It is submitted with the understanding that it will not be used to interpret or limit the scope of meaning of the claims.

What we claim:

1. A loop filter, comprising:
    at least one low pass filter disposed between an input terminal and an output terminal;
    a configuration circuit coupled to the input terminal, and operable to switch the loop filter between a first mode where a transfer function of the loop filter has a non-integrating transfer characteristic, and a second mode where the transfer function has an integrating transfer characteristic, the configuration circuit comprising:
        a series circuit comprising a series circuit switch and a series circuit resistance coupled together in series, the series circuit coupled between the input terminal and a reference potential node;
        a pole capacitance coupled in parallel with the series circuit between the input terminal and the reference potential node;
        a stability circuit comprising a stabilization resistance selectively coupled in series to a stabilization capacitance via a stabilization switch, the stability circuit coupled between the input terminal and the reference potential node or another fixed potential node,
    wherein in the first mode the series circuit switch is closed and the stabilization switch is open, and the pole capacitance does not form a circuit pole and defines a non-integrating transfer function, and
    wherein in the second mode the series circuit switch is open and the stabilization switch is closed, and wherein the pole capacitance in the second mode creates a circuit pole and defines an integrating transfer function.

2. The loop filter of claim 1, wherein the pole capacitance is selectively connected in parallel with the series circuit via a first switch, wherein the first switch is closed in the first mode and open in the second mode.

3. The loop filter of claim 2, wherein the pole capacitance is selectively connected in parallel with the stabilization capacitance via a second switch, wherein the second switch is closed in the first mode and open in the second mode.

4. The loop filter of claim 1, wherein the stabilization capacitance comprises a plurality of individual capacitances coupled together in parallel, wherein the individual capacitances are decoupled from the stabilization resistance and coupled in parallel with the series circuit between the input terminal and the reference potential node in the first mode.

5. The loop filter of claim 1, wherein one of the at least one low pass filter comprises:
    a variable resistance coupled between the input terminal and the output terminal; and
    a filter capacitance coupled between the output terminal and the reference potential node.

6. The loop filter of claim 5, wherein the variable resistance comprises a first resistance in the first mode, and a second resistance in the second mode, wherein the first resistance is greater than the second resistance.

7. The loop filter of claim 5, wherein the variable resistance comprises:
    a first filter resistance and a second filter resistance connected together in series; and
    a filter switch coupled in parallel with the first resistance, wherein the filter switch is open in the first mode and the first resistance comprises a sum of the first filter resistance and the second filter resistance, and
    wherein the filter switch is closed in the second mode and the second resistance comprises the second filter resistance.

8. The loop filter of claim 5, wherein the filter capacitance comprises:
    a first filter capacitance coupled in series with a filter capacitance switch; and a second filter capacitance coupled in parallel with the series combination of the first filter capacitance and the filter capacitance switch, wherein the filter capacitance switch is open in the first mode and the filter capacitance comprises a sum of the first filter capacitance and the second filter capacitance, and wherein the filter capacitance switch is closed in the second mode and the filter capacitance comprises the second filter capacitance.

9. A loop filter, comprising:

a low pass filter coupled between an input terminal and an output terminal;

a selectively adjustable filter transfer function block coupled between the input terminal and a reference potential node, wherein the selectively adjustable filter transfer function block comprises:

a pole capacitance; and a series circuit switch, wherein when the series circuit switch is closed the pole capacitance does not provide a pole to the transfer function of the loop filter, and when the series circuit switch is open the pole capacitance does provide a pole to the transfer function of the loop filter, wherein in a first mode the adjustable filter transfer function block does not provide a pole for a filter transfer function associated therewith and provides a non-integrating transfer function, wherein in a second mode the adjustable filter transfer function block provides a pole for the filter transfer function and provides an integrating transfer function, and wherein the series circuit switch is in series with a series circuit resistance to form a series circuit between the input terminal and the reference potential node, and the pole capacitance is coupled in parallel with the series circuit.

10. The loop filter of claim 9, wherein the pole capacitance is selectively coupled in parallel with the series circuit via a first switch that is open in the first mode and closed in the second mode.

11. The loop filter of claim 10, wherein the pole capacitance is selectively coupled in parallel with a stabilization capacitance via a second switch that is closed in the first mode and open in the second mode.

12. The loop filter of claim 11, wherein the stabilization capacitance comprises a plurality of individual capacitances coupled together in parallel, wherein the individual capacitances are decoupled from the stabilization resistance and coupled in parallel with the series circuit between the input terminal and the reference potential node in the first mode.

13. A loop filter, comprising:

a low pass filter coupled between an input terminal and an output terminal;

a selectively adjustable filter transfer function block coupled between the input terminal and a reference potential node, wherein in a first mode the adjustable filter transfer function block does not provide a pole for a filter transfer function associated therewith and provides a non-integrating transfer function, and wherein in a second mode the adjustable filter transfer function block provides a pole for the filter transfer function and provides an integrating transfer function, wherein the low pass filter comprises:

a variable resistance coupled between the input terminal and the output terminal; and a filter capacitance coupled between the output terminal and the reference potential node, and wherein the variable resistance comprises a first resistance in the first mode, and a second resistance in the second mode, wherein the first resistance is greater than the second resistance, or wherein the variable resistance comprises:

a first filter resistance and a second filter resistance connected together in series; and a filter switch coupled in parallel with the first resistance, wherein the filter switch is open in the first mode and the first resistance comprises a sum of the first filter resistance and the second filter resistance, and wherein the filter switch is closed in the second mode and the second resistance comprises the second filter resistance, or wherein the filter capacitance comprises:

a first filter capacitance coupled in series with a filter capacitance switch; and a second filter capacitance coupled in parallel with the series combination of the first filter capacitance and the filter capacitance switch, wherein the filter capacitance switch is open in the first mode and the filter capacitance comprises a sum of the first filter capacitance and the second filter capacitance, and wherein the filter capacitance switch is closed in the second mode and the filter capacitance comprises the second filter capacitance.

14. A loop filter, comprising:

at least one low pass filter disposed between an input terminal and an output terminal;

a configuration circuit coupled to the input terminal, and operable to switch the loop filter between a first mode where a transfer function of the loop filter has a non-integrating transfer characteristic, and a second mode where the transfer function has an integrating transfer characteristic, the configuration circuit comprising:

a series circuit comprising a series circuit switch and a series circuit resistance coupled together in series, the series circuit coupled between the input terminal and a reference potential node;

a pole capacitance coupled in parallel with the series circuit between the input terminal and the reference potential node;

wherein in the first mode the series circuit switch is closed, and the pole capacitance does not form a circuit pole and defines a non-integrating transfer function, and wherein in the second mode the series circuit switch is open, and wherein the pole capacitance in the second mode creates a circuit pole and defines an integrating transfer function.

15. The loop filter of claim 14, further comprising:

a stability circuit comprising a stabilization resistance selectively coupled in series to a stabilization capacitance via a stabilization switch, the stability circuit coupled between the input terminal and the reference potential node or another fixed potential node, wherein in the first mode the stabilization switch is open, and in the second mode the stabilization switch is closed.

16. The loop filter of claim 15, wherein the pole capacitance is selectively connected in parallel with the series circuit via a first switch, wherein the first switch is closed in the first mode and open in the second mode.

17. The loop filter of claim 16, wherein the pole capacitance is selectively connected in parallel with the stabilization capacitance via a second switch, wherein the second switch is closed in the first mode and open in the second mode.

18. The loop filter of claim 15, wherein the stabilization capacitance comprises a plurality of individual capacitances coupled together in parallel, wherein the individual capacitances are decoupled from the stabilization resistance and coupled in parallel with the series circuit between the input terminal and the reference potential node in the first mode.

19. The loop filter of claim 14, wherein one of the at least one low pass filter comprises:
   a variable resistance coupled between the input terminal and the output terminal, wherein the variable resistance comprises a first resistance in the first mode, and a second resistance in the second mode, wherein the first resistance is greater than the second resistance; and
   a filter capacitance coupled between the output terminal and the reference potential node.

20. The loop filter of claim 19,
   wherein the variable resistance comprises:
      a first filter resistance and a second filter resistance connected together in series; and
      a filter switch coupled in parallel with the first resistance,
         wherein the filter switch is open in the first mode and the first resistance comprises a sum of the first filter resistance and the second filter resistance, and
   wherein the filter switch is closed in the second mode and the second resistance comprises the second filter resistance, and
   wherein the filter capacitance comprises:
      a first filter capacitance coupled in series with a filter capacitance switch; and
      a second filter capacitance coupled in parallel with the series combination of the first filter capacitance and the filter capacitance switch,
      wherein the filter capacitance switch is open in the first mode and the filter capacitance comprises a sum of the first filter capacitance and the second filter capacitance, and
   wherein the filter capacitance switch is closed in the second mode and the filter capacitance comprises the second filter capacitance.

* * * * *